US005390196A

United States Patent [19]

Cecil et al.

[11] Patent Number: 5,390,196

[45] Date of Patent: Feb. 14, 1995

[54] BYTE-WISE DETERMINATION OF A CHECKSUM FROM A CRC-32 POLYNOMIAL

[75] Inventors: Brian D. Cecil, Gilbert; Edmund Kaemper, Phoenix, both of Ariz.

[73] Assignee: Bull HN Information Systems Inc., Billerica, Mass.

[21] Appl. No.: 975,311

[22] Filed: Nov. 12, 1992

[51] Int. Cl.[6] .............................................. G06F 11/12

[52] U.S. Cl. .................................................. 371/37.1

[58] Field of Search .................... 371/37.1, 38.1, 39.1, 371/40.1, 53, 54, 48, 40.1–40.4

[56] References Cited

U.S. PATENT DOCUMENTS

| | | | |
|---|---|---|---|
| 4,712,215 | 12/1987 | Joshi et al. | 371/37 |
| 4,720,830 | 1/1988 | Joshi et al. | 371/37 |
| 4,720,831 | 1/1988 | Joshi et al. | 371/37 |
| 4,723,243 | 2/1988 | Joshi et al. | 371/37 |
| 5,251,215 | 10/1993 | Dravida et al. | 370/94.1 |
| 5,282,214 | 1/1994 | Dravida | 371/37.6 |

OTHER PUBLICATIONS

Powers, IBM Technical Disclosure Bulletin, "Dual Length Cyclic Redundancy Check Circuit", vol. 18, No. 7, Dec. 1975.

Beaven, IBM Tech. Disc. Bulletin, "Parallel Programmable Array-Structured CRC Generator", vol. 21, No. 5, Oct. 1978.

IBM Tech. Disc. Bulletin, "Cyclic Redundancy Checking For Multiple Valued Logic", vol. 34, No. 11, Apr. 1992.

IBM Tech. Disc. Bulletin, "High Efficiency Real Time Cyclic Redundancy Checker/Generator For Integrated Serv. Dig. Net.," vol. 34, No. 10B, Mar. 1992.

Breslau et al, IBM Tech. Disc. Bulletin, "Cyclic Redundancy Check for SDLC Architecture," vol. 19, No. 2, Nov. 1976.

Hinkel, IBM Tech. Disc. Bulletin, "Utilization of CRC Bytes For Error Correction on Multiple Formatted Data Strings", vol. 24, No. 1B, Jun. 1981.

IBM Tech. Disc. Bulletin, "Robust Complement/Recomplement Method," vol. 34, No. 10A, Mar. 1992.

*Primary Examiner*—Roy N. Envall, Jr.
*Assistant Examiner*—Cameron H. Tousi
*Attorney, Agent, or Firm*—J. S. Solakian; J. H. Phillips

[57] ABSTRACT

A fast and memory efficient software method for generating a checksum employing a 32-bit generator polynomial such as $X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$. This end is achieved by performing the successive steps of reversing the 32-bit polynomial, to obtain hexadecimal EDB88320 in the example, as an initial CRC; XORing the least significant unprocessed byte of the data set with the least significant 8-bit byte of the CRC as currently positioned to obtain X8, X7, X6, X5, X4, X3, X2, X1; shifting the CRC right eight bits; for Xi=X8 to X3, inclusive, successively testing the highest numbered unprocessed Xi bit to determine if it is a one or a zero; if the Xi bit being tested is a zero, the CRC remains unchanged for this bit; if the Xi bit being tested is a one, then XOR the shifted CRC with the a 32-bit pattern of Xi corresponding to EDB88320 shifted right zero places for X8, one place for X7, two places for X6, three places for X5, four places for X4 and five places for X3; for Xi=X2 and X1, successively testing the highest numbered unprocessed Xi bit to determine if it is a one or a zero; if the Xi bit being tested is a zero, the CRC remains unchanged for this bit; if the Xi bit being tested is a one, then XOR the shifted CRC with the a 32-bit pattern of Xi corresponding to a second predetermined polynomial, hexadecimal EE0E612C in the example, shifted right zero places for X2 and one place for X1; if bytes of the data set remain to be processed, looping to process the next byte; and if the last byte has been processed, appending the current value of the CRC to the data set as a checksum.

2 Claims, 12 Drawing Sheets

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 8 | M8 | | | | | | | | | C32 | C31 | C30 | C29 | C28 | C27 | C26 | C25 |
| | | X8 | X8 | X8 | | X8 | X8 | | X8 | X8 | | X8 | X8 | X8 | | | |
| | | | X7 | X7 | X7 | | X7 | X7 | | X7 | X7 | | X7 | X7 | X7 | | |
| | | | | X6 | X6 | X6 | | X6 | X6 | | X6 | X6 | | X6 | X6 | X6 | |
| | | | | | X5 | X5 | X5 | | X5 | X5 | | X5 | X5 | | X5 | X5 | X5 |
| | | | | | | X4 | X4 | X4 | | X4 | X4 | | X4 | | | X4 | X4 |
| | | | | | | | X3 | X3 | X3 | | X3 | X3 | | X3 | X3 | | X3 |
| | | X2 | X2 | X2 | | X2 | X2 | X2 | | | | | | X2 | X2 | X2 | |
| | | | X1 | X1 | X1 | | X1 | X1 | X1 | | | | | | X1 | X1 | X1 |

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C24 | C23 | C22 | C21 | C20 | C19 | C18 | C17 | C16 | C15 | C14 | C13 | C12 | C11 | C10 | C9 |
| X8 | | | | | | X8 | X8 | | | X8 | | | | | |
| | X7 | | | | | | X7 | X7 | | | X7 | | | | |
| | | X6 | | | | | | X6 | X6 | | | X6 | | | |
| | | | X5 | | | | | | X5 | X5 | | | X5 | | |
| X4 | | | | X4 | | | | | | X4 | X4 | | | X4 | |
| X3 | X3 | | | | X3 | | | | | | X3 | X3 | | | X3 |
| | X2 | X2 | | | | | X2 | | | X2 | | X2 | X2 | | |
| | | X1 | X1 | | | | | X1 | | | X1 | | X1 | X1 | |

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 0 | | C32 | C31 | C30 | C29 | C28 | C27 | C26 | C25 | C24 | C23 | C22 | C21 | C20 | C19 | C18 | C17 |

FIG. 2A

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 1 | M1 | C1 | C32 | C31 | C30 | C29 | C28 | C27 | C26 | C25 | C24 | C23 | C22 | C21 | C20 | C19 | C18 |
| | | M1 | C1 | C1 | | C1 | C1 | | C1 | C1 | | C1 | C1 | C1 | | | |
| | | | M1 | M1 | | M1 | M1 | | M1 | M1 | | M1 | M1 | M1 | | | |

FIG. 3A

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 2 | M2 | C2 | C1 | C32 | C31 | C30 | C29 | C28 | C27 | C26 | C25 | C24 | C23 | C22 | C21 | C20 | C19 |
| | | M2 | M1 | C1 | C1 | C2 | C1 | C1 | C2 | C1 | C1 | C1 | C1 | C1 | C1 | | |
| | | | C2 | M1 | M1 | M2 | M1 | M1 | M2 | M1 | M1 | M1 | M1 | M1 | M1 | | |
| | | | M2 | C2 | | | C2 | | | C2 | | | C2 | C2 | | | |
| | | | | M2 | | | M2 | | | M2 | | | M2 | M2 | | | |

FIG. 4A

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 3 | M3 | C3 | C2 | C1 | C32 | C31 | C30 | C29 | C28 | C27 | C26 | C25 | C24 | C23 | C22 | C21 | C20 |
| | | M3 | M2 | M1 | C1 | C1 | C2 | C1 | C1 | C2 | C1 | C1 | C1 | C1 | C1 | C1 | |
| | | | C3 | C2 | M1 | M1 | M2 | M1 | M1 | M2 | M1 | M1 | M1 | M1 | M1 | M1 | |
| | | | M3 | M2 | C2 | C3 | C3 | C2 | C3 | C3 | C2 | C3 | C3 | C2 | C2 | | |
| | | | | C3 | M2 | M3 | M3 | M2 | M3 | M3 | M2 | M3 | M3 | M2 | M2 | | |
| | | | | M3 | | | | | | | | | | C3 | | | |
| | | | | | | | | | | | | | | M3 | | | |

FIG. 5A

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C16 | C15 | C14 | C13 | C12 | C11 | C10 | C9 | C8 | C7 | C6 | C5 | C4 | C3 | C2 | C1 |

FIG. 2B

| | | | | | | | | | | | | | | | |
|---|---|---|---|---|---|---|---|---|---|---|---|---|---|---|---|
| C17 | C16 | C15 | C14 | C13 | C12 | C11 | C10 | C9 | C8 | C7 | C6 | C5 | C4 | C3 | C2 |
| C1 | | | | | | C1 | C1 | | | C1 | | | | | |
| M1 | | | | | | M1 | M1 | | | M1 | | | | | |

FIG. 3B

| | | | | | | | | | | | | | | | |
|---|---|---|---|---|---|---|---|---|---|---|---|---|---|---|---|
| C18 | C17 | C16 | C15 | C14 | C13 | C12 | C11 | C10 | C9 | C8 | C7 | C6 | C5 | C4 | C3 |
| C2 | C1 | | | | | C2 | C1 | C1 | | C2 | C1 | | | | |
| M2 | M1 | | | | | M2 | M1 | M1 | | M2 | M1 | | | | |
| | | | | | | | C2 | | | | | | | | |
| | | | | | | | M2 | | | | | | | | |

FIG. 4B

| | | | | | | | | | | | | | | | |
|---|---|---|---|---|---|---|---|---|---|---|---|---|---|---|---|
| C19 | C18 | C17 | C16 | C15 | C14 | C13 | C12 | C11 | C10 | C9 | C8 | C7 | C6 | C5 | C4 |
| C3 | C2 | C1 | | | | C3 | C2 | C1 | C1 | C3 | C2 | C1 | | | |
| M3 | M2 | M1 | | | | M3 | M2 | M1 | M1 | M3 | M2 | M1 | | | |
| | | | | | | | C3 | C2 | | | | | | | |
| | | | | | | | M3 | M2 | | | | | | | |

FIG. 5B

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 4 | M4 | C4 | C3 | C2 | C1 | C32 | C31 | C30 | C29 | C28 | C27 | C26 | C25 | C24 | C23 | C22 | C21 |
| | | M4 | M3 | M2 | M1 | C1 | C1 | C2 | C1 | C1 | C2 | C1 | C1 | C2 | C1 | C1 | C1 |
| | | | C4 | C3 | C2 | M1 | M1 | M2 | M1 | M1 | M2 | M1 | M1 | M2 | M1 | M1 | M1 |
| | | | M4 | M3 | M2 | C2 | C3 | C3 | C2 | C3 | C3 | C2 | C3 | C3 | C2 | C2 | |
| | | | | C4 | C3 | M2 | M3 | M3 | M2 | M3 | M3 | M2 | M3 | M3 | M2 | M2 | |
| | | | | M4 | M3 | C4 | C4 | | C4 | C4 | | C4 | C4 | C4 | C3 | | |
| | | | | | | M4 | M4 | | M4 | M4 | | M4 | M4 | M4 | M3 | | |

FIG. 6A

| | | | | | | | | | | | | | | | | | |
|---|---|---|---|---|---|---|---|---|---|---|---|---|---|---|---|---|---|
| 5 | M5 | C5 | C4 | C3 | C2 | C1 | C32 | C31 | C30 | C29 | C28 | C27 | C26 | C25 | C24 | C23 | C22 |
| | | M5 | M4 | M3 | M2 | M1 | C1 | C1 | C2 | C1 | C1 | C2 | C1 | C1 | C2 | C1 | C1 |
| | | | C5 | C4 | C3 | C2 | M1 | M1 | M2 | M1 | M1 | M2 | M1 | M1 | M2 | M1 | M1 |
| | | | M5 | M4 | M3 | M2 | C2 | C3 | C3 | C2 | C3 | C3 | C2 | C3 | C3 | C2 | C2 |
| | | | | C5 | C4 | C3 | M2 | M3 | M3 | M2 | M3 | M3 | M2 | M3 | M3 | M2 | M2 |
| | | | | M5 | M4 | M3 | C4 | C4 | C5 | C4 | C4 | C5 | C4 | C4 | C4 | C3 | |
| | | | | | | C5 | M4 | M4 | M5 | M4 | M4 | M5 | M4 | M4 | M4 | M3 | |
| | | | | | | M5 | C5 | | | C5 | | | C5 | C5 | | | |
| | | | | | | | M5 | | | M5 | | | M5 | M5 | | | |

FIG. 7A

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C20 | C19 | C18 | C17 | C16 | C15 | C14 | C13 | C12 | C11 | C10 | C9 | C8 | C7 | C6 | C5 |
| C4 | C3 | C2 | C1 | | | C4 | C3 | C2 | C1 | C1 | C3 | C2 | C1 | | |
| M4 | M3 | M2 | M1 | | | M4 | M3 | M2 | M1 | M1 | M3 | M2 | M1 | | |
| | | | | | | | C4 | C3 | C2 | C4 | | | | | |
| | | | | | | | M4 | M3 | M2 | M4 | | | | | |

FIG. 6B

| | | | | | | | | | | | | | | | |
|---|---|---|---|---|---|---|---|---|---|---|---|---|---|---|---|
| C21 | C20 | C19 | C18 | C17 | C16 | C15 | C14 | C13 | C12 | C11 | C10 | C9 | C8 | C7 | C6 |
| C1 | C4 | C3 | C2 | C1 | | C5 | C4 | C3 | C2 | C1 | C1 | C3 | C2 | C1 | |
| M1 | M4 | M3 | M2 | M1 | | M5 | M4 | M3 | M2 | M1 | M1 | M3 | M2 | M1 | |
| C5 | | | | | | | C5 | C4 | C3 | C2 | C4 | | | | |
| M5 | | | | | | | M5 | M4 | M3 | M2 | M4 | | | | |
| | | | | | | | | | | C5 | | | | | |
| | | | | | | | | | | M5 | | | | | |

FIG. 7B

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 6 | M6 | C6 | C5 | C4 | C3 | C2 | C1 | C32 | C31 | C30 | C29 | C28 | C27 | C26 | C25 | C24 | C23 |
| | | M6 | M5 | M4 | M3 | M2 | M1 | C1 | C1 | C2 | C1 | C1 | C2 | C1 | C1 | C2 | C1 |
| | | | C6 | C5 | C4 | C3 | C2 | M1 | M1 | M2 | M1 | M1 | M2 | M1 | M1 | M2 | M1 |
| | | | M6 | M5 | M4 | M3 | M2 | C2 | C3 | C3 | C2 | C3 | C3 | C2 | C3 | C3 | C2 |
| | | | | C6 | C5 | C4 | C3 | M2 | M3 | M3 | M2 | M3 | M3 | M2 | M3 | M3 | M2 |
| | | | | M6 | M5 | M4 | M3 | C4 | C4 | C5 | C4 | C4 | C5 | C4 | C4 | C4 | C3 |
| | | | | | | C6 | C5 | M4 | M4 | M5 | M4 | M4 | M5 | M4 | M4 | M4 | M3 |
| | | | | | | M6 | M5 | C5 | C6 | C6 | C5 | C6 | C6 | C5 | C5 | | |
| | | | | | | | C6 | M5 | M6 | M5 | M6 | M6 | M5 | M5 | | | |
| | | | | | | | M6 | | | | | | | C6 | | | |
| | | | | | | | | | | | | | | M6 | | | |

FIG. 8A

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 7 | M7 | C7 | C6 | C5 | C4 | C3 | C2 | C1 | C32 | C31 | C30 | C29 | C28 | C27 | C26 | C25 | C24 |
| | | M7 | M6 | M5 | M4 | M3 | M2 | M1 | C1 | C1 | C2 | C1 | C1 | C2 | C1 | C1 | C2 |
| | | C1 | C7 | C6 | C5 | C4 | C3 | C2 | M1 | M1 | M2 | M1 | M1 | M2 | M1 | M1 | M2 |
| | | M1 | M7 | M6 | M5 | M4 | M3 | M2 | C2 | C3 | C3 | C2 | C3 | C3 | C2 | C3 | C3 |
| | | | C1 | C7 | C6 | C5 | C4 | C3 | M2 | M3 | M3 | M2 | M3 | M3 | M2 | M3 | M3 |
| | | | M1 | M7 | M6 | M5 | M4 | M3 | C4 | C4 | C5 | C4 | C4 | C5 | C4 | C4 | C4 |
| | | | | C1 | | C7 | C6 | C5 | M4 | M4 | M5 | M4 | M4 | M5 | M4 | M4 | M4 |
| | | | | M1 | | M7 | M6 | M5 | C5 | C6 | C6 | C5 | C6 | C6 | C5 | C5 | |
| | | | | | | C1 | C7 | C6 | M5 | M6 | M6 | M5 | M6 | M6 | M5 | M5 | |
| | | | | | | M1 | M7 | M6 | C7 | C7 | | C7 | C7 | C7 | C6 | | |
| | | | | | | | C1 | | M7 | M7 | | M7 | M7 | M7 | M6 | | |
| | | | | | | | M1 | | C1 | C1 | | C1 | C1 | C1 | | | |
| | | | | | | | | | M1 | M1 | | M1 | M1 | M1 | | | |

FIG.9A

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C22 | C21 | C20 | C19 | C18 | C17 | C16 | C15 | C14 | C13 | C12 | C11 | C10 | C9 | C8 | C7 |
| C1 | C1 | C4 | C3 | C2 | C1 | C6 | C5 | C4 | C3 | C2 | C1 | C1 | C3 | C2 | C1 |
| M1 | M1 | M4 | M3 | M2 | M1 | M6 | M5 | M4 | M3 | M2 | M1 | M1 | M3 | M2 | M1 |
| C2 | C5 | | | | | | C6 | C5 | C4 | C3 | C2 | C4 | | | |
| M2 | M5 | | | | | | M6 | M5 | M4 | M3 | M2 | M4 | | | |
| C6 | | | | | | | | | | C6 | C5 | | | | |
| M6 | | | | | | | | | | M6 | M5 | | | | |

FIG. 8B

| | | | | | | | | | | | | | | | |
|---|---|---|---|---|---|---|---|---|---|---|---|---|---|---|---|
| C23 | C22 | C21 | C20 | C19 | C18 | C17 | C16 | C15 | C14 | C13 | C12 | C11 | C10 | C9 | C8 |
| C1 | C1 | C1 | C4 | C3 | C2 | C1 | C6 | C5 | C4 | C3 | C2 | C1 | C1 | C3 | C2 |
| M1 | M1 | M1 | M4 | M3 | M2 | M1 | M6 | M5 | M4 | M3 | M2 | M1 | M1 | M3 | M2 |
| C2 | C2 | C5 | | | | C7 | C7 | C6 | C5 | C4 | C3 | C2 | C4 | | |
| M2 | M2 | M5 | | | | M7 | M7 | M6 | M5 | M4 | M3 | M2 | M4 | | |
| C3 | C6 | | | | | C1 | C1 | | | C7 | C6 | C5 | | | |
| M3 | M6 | | | | | M1 | M1 | | | M7 | M6 | M5 | | | |
| C7 | | | | | | | | | | C1 | | | | | |
| M7 | | | | | | | | | | M7 | | | | | |
| C1 | | | | | | | | | | | | | | | |
| M1 | | | | | | | | | | | | | | | |

FIG. 9B

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 8 | M8 | C8 | C7 | C6 | C5 | C4 | C3 | C2 | C1 | C32 | C31 | C30 | C29 | C28 | C27 | C26 | C25 |
| | | M8 | M7 | M6 | M5 | M4 | M3 | M2 | M1 | C1 | C1 | C2 | C1 | C1 | C2 | C1 | C1 |
| | | C2 | C1 | C7 | C6 | C5 | C4 | C3 | C2 | M1 | M1 | M2 | M1 | M1 | M2 | M1 | M1 |
| | | M2 | M1 | M7 | M6 | M5 | M4 | M3 | M2 | C2 | C3 | C3 | C2 | C3 | C3 | C2 | C3 |
| | | | C8 | C1 | C7 | C6 | C5 | C4 | C3 | M2 | M3 | M3 | M2 | M3 | M3 | M2 | M3 |
| | | | M8 | M1 | M7 | M6 | M5 | M4 | M3 | C4 | C4 | C5 | C4 | C4 | C5 | C4 | C4 |
| | | | C2 | C8 | C1 | C8 | C7 | C6 | C5 | M4 | M4 | M5 | M4 | M4 | M5 | M4 | M4 |
| | | | M2 | M8 | M1 | M8 | M7 | M6 | M5 | C5 | C6 | C6 | C5 | C6 | C6 | C5 | C5 |
| | | | | C2 | | C2 | C1 | C7 | C6 | M5 | M6 | M6 | M5 | M6 | M6 | M5 | M5 |
| | | | | M2 | | M2 | M1 | M7 | M6 | C7 | C7 | C8 | C7 | C7 | C7 | C6 | |
| | | | | | | | C8 | C1 | C8 | M7 | M7 | M8 | M7 | M7 | M7 | M6 | |
| | | | | | | | M8 | M1 | M8 | C1 | C1 | C2 | C1 | C1 | C1 | | |
| | | | | | | | C2 | | C2 | M1 | M1 | M2 | M1 | M1 | M1 | | |
| | | | | | | | M2 | | M2 | C8 | | | C8 | C8 | | | |
| | | | | | | | | | | M8 | | | M8 | M8 | | | |
| | | | | | | | | | | C2 | | | C2 | C2 | | | |
| | | | | | | | | | | M2 | | | M2 | M2 | | | |

FIG. 10A

| R1 | R2 | R3 | R4 | R5 | R6 | R7 | R8 | R9 | R10 | R11 | R12 | R13 | R14 | R15 | R16 |
|---|---|---|---|---|---|---|---|---|---|---|---|---|---|---|---|
| C9 | C10 | C11 | C12 | C13 | C14 | C15 | C16 | C17 | C18 | C19 | C20 | C21 | C22 | C23 | C24 |
| C3 | C1 | C1 | C2 | C3 | C4 | C5 | C6 | C1 | C2 | C3 | C4 | C1 | C1 | C1 | C2 |
| M3 | M1 | M1 | M2 | M3 | M4 | M5 | M6 | M1 | M2 | M3 | M4 | M1 | M1 | M1 | M2 |
| | C4 | C2 | C3 | C4 | C5 | C6 | C7 | C7 | C8 | | | C5 | C2 | C2 | C3 |
| | M4 | M2 | M3 | M4 | M5 | M6 | M7 | M7 | M8 | | | M5 | M2 | M2 | M3 |
| | | C5 | C6 | C7 | C8 | | C1 | C1 | C2 | | | | C6 | C3 | C4 |
| | | M5 | M6 | M7 | M8 | | M1 | M1 | M2 | | | | M6 | M3 | M4 |
| | | | | C1 | C2 | | | C8 | | | | | | C7 | C8 |
| | | | | M1 | M2 | | | M8 | | | | | | M7 | M8 |
| | | | | | | | | C2 | | | | | | C1 | C2 |
| | | | | | | | | M2 | | | | | | M1 | M2 |

FIG. 10B

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 8 | M8 | C8 | C8 | C8 | C7 | C8 | C8 | C7 | C8 | C32 | C31 | C30 | C29 | C28 | C27 | C26 | C25 |
| | | M8 | M8 | M8 | M7 | M8 | M8 | M7 | M8 | C8 | C7 | C8 | C8 | C8 | C7 | C6 | C5 |
| | | C2 | C7 | C7 | C6 | C6 | C7 | C6 | C6 | M8 | M7 | M8 | M8 | M8 | M7 | M6 | M5 |
| | | M2 | M7 | M7 | M6 | M6 | M7 | M6 | M6 | C7 | C6 | C6 | C7 | C7 | C6 | C5 | C4 |
| | | | C2 | C6 | C5 | C5 | C5 | C4 | C5 | M7 | M6 | M6 | M7 | M7 | M6 | M5 | M4 |
| | | | M2 | M6 | M5 | M5 | M5 | M4 | M5 | C5 | C4 | C5 | C5 | C6 | C5 | C4 | C3 |
| | | | C1 | C2 | C1 | C4 | C4 | C3 | C3 | M5 | M4 | M5 | M5 | M6 | M5 | M4 | M3 |
| | | | M1 | M2 | M1 | M4 | M4 | M3 | M3 | C4 | C3 | C3 | C4 | C3 | C3 | C2 | C1 |
| | | | | C1 | | C2 | C3 | C2 | C1 | M4 | M3 | M3 | M4 | M3 | M3 | M2 | M1 |
| | | | | M1 | | M2 | M3 | M2 | M1 | | | | | C2 | C2 | C1 | |
| | | | | | | | C2 | C1 | | | | | | M2 | M2 | M1 | |
| | | | | | | | M2 | M1 | | | | | | | C1 | | |
| | | | | | | | C1 | | | | | | | | M1 | | |
| | | | | | | | M1 | | | | | | | | | | |

FIG. 11A

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 8 | M8 | X8 | X8 | X8 | X7 | X8 | X8 | X7 | X8 | C32 | C31 | C30 | C29 | C28 | C27 | C26 | C25 |
| | | X2 | X7 | X7 | X6 | X6 | X7 | X6 | X6 | X8 | X7 | X8 | X8 | X8 | X7 | X6 | X5 |
| | | | X2 | X6 | X5 | X5 | X5 | X4 | X5 | X7 | X6 | X6 | X7 | X7 | X6 | X5 | X4 |
| | | | X1 | X2 | X1 | X4 | X4 | X3 | X3 | X5 | X4 | X5 | X5 | X6 | X5 | X4 | X3 |
| | | | | X1 | | X2 | X3 | X2 | X1 | X4 | X3 | X3 | X4 | X3 | X3 | X2 | X1 |
| | | | | | | | X2 | X1 | | | | | | X2 | X2 | X1 | |
| | | | | | | | X1 | | | | | | | | X1 | | |

FIG. 12A

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C24 | C23 | C22 | C21 | C20 | C19 | C18 | C17 | C16 | C15 | C14 | C13 | C12 | C11 | C10 | C9 |
| C8 | C7 | C6 | C5 | C4 | C3 | C8 | C8 | C7 | C6 | C8 | C7 | C6 | C5 | C4 | C3 |
| M8 | M7 | M6 | M5 | M4 | M3 | M8 | M8 | M7 | M6 | M8 | M7 | M6 | M5 | M4 | M3 |
| C4 | C3 | C2 | C1 | | | | C7 | C6 | C5 | C5 | C4 | C3 | C2 | C1 | |
| M4 | M3 | M2 | M1 | | | | M7 | M6 | M5 | M5 | M4 | M3 | M2 | M1 | |
| C3 | C2 | C1 | | | | | C2 | C1 | | C4 | C3 | C2 | C1 | | |
| M3 | M2 | M1 | | | | | M2 | M1 | | M4 | M3 | M2 | M1 | | |
| | | | | | | | | | | C2 | C1 | | | | |
| | | | | | | | | | | M2 | M1 | | | | |

FIG. 11B

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C24 | C23 | C22 | C21 | C20 | C19 | C18 | C17 | C16 | C15 | C14 | C13 | C12 | C11 | C10 | C9 |
| X8 | X7 | X6 | X5 | X4 | X3 | X8 | X8 | X7 | X6 | X8 | X7 | X6 | X5 | X4 | X3 |
| X4 | X3 | X2 | X1 | | | | X7 | X6 | X5 | X5 | X4 | X3 | X2 | X1 | |
| X3 | X2 | X1 | | | | | X2 | X1 | | X4 | X3 | X2 | X1 | | |
| | | | | | | | | | | X2 | X1 | | | | |

FIG. 12B

| SH | IN | R32 | R31 | R30 | R29 | R28 | R27 | R26 | R25 | R24 | R23 | R22 | R21 | R20 | R19 | R18 | R17 |
|---|---|---|---|---|---|---|---|---|---|---|---|---|---|---|---|---|---|
| 8 | M8 | | | | | | | | | C32 | C31 | C30 | C29 | C28 | C27 | C26 | C25 |
| | | X8 | X8 | X8 | | X8 | X8 | | X8 | X8 | | X8 | X8 | X8 | | | |
| | | | X7 | X7 | X7 | | X7 | X7 | | X7 | X7 | | X7 | X7 | X7 | | |
| | | | | X6 | X6 | X6 | | X6 | X6 | | X6 | X6 | | X6 | X6 | X6 | |
| | | | | | X5 | X5 | X5 | | X5 | X5 | | X5 | X5 | | X5 | X5 | X5 |
| | | | | | | X4 | X4 | X4 | | X4 | X4 | | X4 | | | X4 | X4 |
| | | | | | | | X3 | X3 | X3 | | X3 | X3 | | X3 | X3 | | X3 |
| | | X2 | X2 | X2 | | X2 | X2 | X2 | | | | | | X2 | X2 | X2 | |
| | | | X1 | X1 | X1 | | X1 | X1 | X1 | | | | | | X1 | X1 | X1 |

| R16 | R15 | R14 | R13 | R12 | R11 | R10 | R9 | R8 | R7 | R6 | R5 | R4 | R3 | R2 | R1 |
|---|---|---|---|---|---|---|---|---|---|---|---|---|---|---|---|
| C24 | C23 | C22 | C21 | C20 | C19 | C18 | C17 | C16 | C15 | C14 | C13 | C12 | C11 | C10 | C9 |
| X8 | | | | | | X8 | X8 | | | X8 | | | | | |
| | X7 | | | | | | X7 | X7 | | | X7 | | | | |
| | | X6 | | | | | | X6 | X6 | | | X6 | | | |
| | | | X5 | | | | | | X5 | X5 | | | X5 | | |
| X4 | | | | X4 | | | | | | X4 | X4 | | | X4 | |
| X3 | X3 | | | | X3 | | | | | | X3 | X3 | | | X3 |
| | X2 | X2 | | | | | X2 | | | X2 | | X2 | X2 | | |
| | | X1 | X1 | | | | | X1 | | | X1 | | X1 | X1 | |

FIG. 13

BYTE-WISE DETERMINATION OF A CHECKSUM FROM A CRC-32 POLYNOMIAL

FIELD OF THE INVENTION

This invention relates to cyclic redundancy codes and, more particularly, to a 32-bit cyclic redundancy code implemented in software.

BACKGROUND OF THE INVENTION

A Cyclic Redundancy Code (CRC) is a means by which the integrity of data communications and storage can be verified. The unit of data to be validated may be as small as eight bits or as large as several thousand bytes. The most common of these data transfer applications is the "hard" and "floppy" disk storage devices which are a part of nearly every computer system. Another use of a CRC is in the transmission of data from one computer system to another. Still another use of a CRC is in validating the contents of Read Only Memory (ROM) which contains the kernel of an operating system and/or the code which is executed when a computer has power applied to it. Often, this ROM code is checked as a part of a power up test sequence. The lengths of the most common CRC codes are eight and sixteen bits. CRC-32 is a 32 bit code which increases the number of bits of data that can be verified with one CRC.

A binary polynomial is a polynomial in which all coefficients are either one or zero. A CRC is generated by dividing data to be validated by a predetermined binary polynomial prior to storage or transmission. The remainder from the division operation is the CRC or "checksum", and this code is usually appended to the data to be validated. For validation, the data with the appended CRC is divided again by the same polynomial. If the data is unchanged, a zero remainder will result. Anything other than a zero remainder indicates that the data has been corrupted.

The following example illustrates the calculation and use of a CRC:

$M$ = binary message sent = 10010101

$P$ = predetermined binary polynominal
$= X^{16} + X^{15} + X^2 + X^0 = 11000000000000101$ $Q$ = quotient of the division operation (not used in a CRC)

$R$ = remainder of the division (the remainder is the code sent in a CRC)

$2^k$ = number by which to multiply message (shift the message left $k$ bits where $k$ equals the degree of the polynomial)

Thus: $(2^kM)/P = Q + R/P$ where the "+" denotes the exclusive-OR operation (division is done in modulo 2 arithmetic which is simply the exclusive-OR operation). In modulo 2 arithmetic, addition is the same as subtraction. Using this property:

$$2^kM+R=QP$$

$2^k$M+R is simply the shifted data with the remainder appended. It will be noted that both sides of the equation are evenly divisible by the predetermined polynomial, P. The shifted data plus the remainder is what is transmitted or stored. When the data, including the remainder, is again divided by the polynomial, the remainder will be zero if the data and checksum are unchanged.

With the data given above:

$2^k$M = 100101010000000000000000

$(2^k$M$)$/P =

```
                                 11100110 --> Q
11000000000000101/100101010000000000000000
                  11000000000000101
                  10101010000001010
                  11000000000000101
                  11010100000011110
                  11000000000000101
                  00101000000110110
                  00000000000000000
                  01010000001101100
                  00000000000000000
                  10100000011011000
                  11000000000000101
                  11000000110111010
                  11000000000000101
                  00000001101111110
                  00000000000000000
                   0000001101111110 --> R
```

$(2^k$M$)$ + R = data with CRC code appended
= 100101010000001101111110

The checking operation will take $(2^k$M$)$+R and divide it by the same generating polynomial P.

```
                                 11100110
11000000000000101/100101010000001101111110
                  11000000000000101
                  10101010000000111
                  11000000000000101
                  11010100000000101
                  11000000000000101
                  00101000000000001
                  00000000000000000
                  01010000000000011
                  00000000000000000
                  10100000000000111
                  11000000000000101
                  11000000000000101
                  11000000000000101
                  00000000000000000
                  00000000000000000
                   0000000000000000 --> R
```

As expected, a zero remainder is obtained indicating no error in the transmission of the data.

CRCs can detect a large number of errors including:

all one or two bit errors;

all odd numbers of bit errors;

all burst errors less than the degree of the predetermined polynomial; and most burst errors greater than the degree of the predetermined polynomial.

CRC polynomials in common use today include:

| | |
|---|---|
| CRC-16 | $X^{16} + X^{15} + X^2 + X^0$ |
| SDLC (IBM, CCITT) | $X^{16} + X^{12} + X^5 + X^0$ |
| CRC-12 | $X^{12} + X^{11} + X^3 + X^2 + X^1 + X^0$ |
| CRC-16 Reverse | $X^{16} + X^{14} + X^1 + X^0$ |
| SDLC Reverse | $X^{16} + X^{11} + X^4 + X^0$ |
| LRCC-16 | $X^{16} + X^0$ |
| LRCC-8 | $X^8 + X^0$ |

Those skilled in the art will understand that choosing a polynomial of a larger degree will result in greater error detection. A high degree generating polynomial is necessary if it is desired to protect more, for example, than the 64K bits, or 8K bytes, that a CRC-16 can protect at one time. That is, a CRC-16 implementation will start repeating itself after $2^{16}$ shifts of the CRC register ($2^{16}$=64K bits). Therefore, with a CRC-16, there may be one byte of data in the first group of 8K bytes which has an identical CRC code in the next group of 8K bytes. On the other hand, a CRC-32 will have a unique CRC code for each of $2^{32}$ shifts of the CRC register. Therefore, with a CRC-32, 536 megabytes of contiguous data can be tested with no repeating CRC code.

Applications which require a higher level of error detection, such as some of those used by the Department of Defense, may use the following CRC-32 polynomial which has become a standard:

$$X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$$

While it would be possible to laboriously perform the division operation described above to obtain a checksum to be appended to data to be transferred, this approach is obviously hopelessly impractical, and "shortcuts" for determining checksums much more efficiently have been developed. Typically, in a modem or other digital transmission device, a CRC is implemented in hardware with the data manipulation carried out in a bit-by-bit operation. In larger scale digital devices and systems, hardware implementation is still usually employed because it is faster. The obvious drawback of hardware implementation of CRCs is that more hardware is required with consequent increase in cost, size and complexity and a decrease in reliability. Software implemented CRCs are known although their use is not widespread because of the speed penalty thought to be inevitable; the trade off has favored hardware. One quasi-software implementation which does enjoy good performance uses CRC routines which generate tables consisting of all possible combinations of the chosen polynomial. The checksum generation is then reduced to a table look-up. These CRC routines are considered to be the fastest software implementations available, but they take up a great deal of dedicated memory.

OBJECTS OF THE INVENTION

It is therefore a broad object of this invention to provide a software implemented checksum generator.

It is a more specific object of this invention to provide a software implemented checksum generator which fast, but which does not require dedicated memory.

It is a still more specific object of one aspect of this invention to provide a fast and memory efficient software implemented checksum generator employing the 32-bit binary polynomial $X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$.

SUMMARY OF THE INVENTION

Briefly, these and other objects of the invention are achieved by performing the successive steps of reversing the 32-bit polynomial generator selected to obtain an initial CRC; XORing the least significant unprocessed byte of the data set with the least significant 8-bit byte of the CRC as currently positioned to obtain X8, X7, X6, X5, X4, X3, X2, X1; shifting the CRC right eight bits; for Xi=X8 to X3, inclusive, successively testing the highest numbered unprocessed Xi bit to determine if it is a one or a zero; if the Xi bit being tested is a zero, the CRC remains unchanged for this bit; if the Xi bit being tested is a one, then XOR the shifted CRC with the a 32-bit pattern of Xi corresponding to the generator polynomial shifted right zero places for X8, one place for X7, two places for X6, three places for X5, four places for X4 and five places for X3; for Xi=X2 and X1, successively testing the highest numbered unprocessed Xi bit to determine if it is a one or a zero; if the Xi bit being tested is a zero, the CRC remains unchanged for this bit; if the Xi bit being tested is a one, then XOR the shifted CRC with the a 32-bit pattern of Xi corresponding to a second polynomial shifted right zero places for X2 and one place for X1; if bytes of the data set remain to be processed, looping to process the next byte; and if the last byte has been processed, appending the current value of the CRC to the data set as a checksum.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

FIG. 2 illustrates the initial contents of the CRC-32 register illustrated in FIG. 1;

FIGS. 3A and 3B taken together represent the contents of the CRC register after a first data bit has been processed;

FIGS. 4A and 4B taken together represent the contents of the CRC register after a second data bit has been processed;

FIGS. 5A and 5B taken together represent the contents of the CRC register after a third data bit has been processed;

FIGS. 6A and 6B taken together represent the contents of the CRC register after a fourth data bit has been processed;

FIGS. 7A and 7B taken together represent the contents of the CRC register after a fifth data bit has been processed;

FIGS. 8A and 8B taken together represent the contents of the CRC register after a sixth data bit has been processed;

FIGS. 9A and 9B taken together represent the contents of the CRC register after a seventh data bit has been processed;

FIGS. 10A and 10B taken together represent the contents of the CRC register after an eighth data bit has been processed;

FIGS. 11A and 11B taken together represent the same contents shown in FIGS. 10A and 10B, but after a first rearrangement and simplification;

FIGS. 12A and 12B taken together represent the same contents shown in FIGS. 11A and 11B, but after a second rearrangement and simplification; and FIG. 13 represents the same contents shown in FIGS. 12A and 12B, but after a third rearrangement and simplification.

DESCRIPTION OF THE PREFERRED EMBODIMENTS(S)

Figure 1:
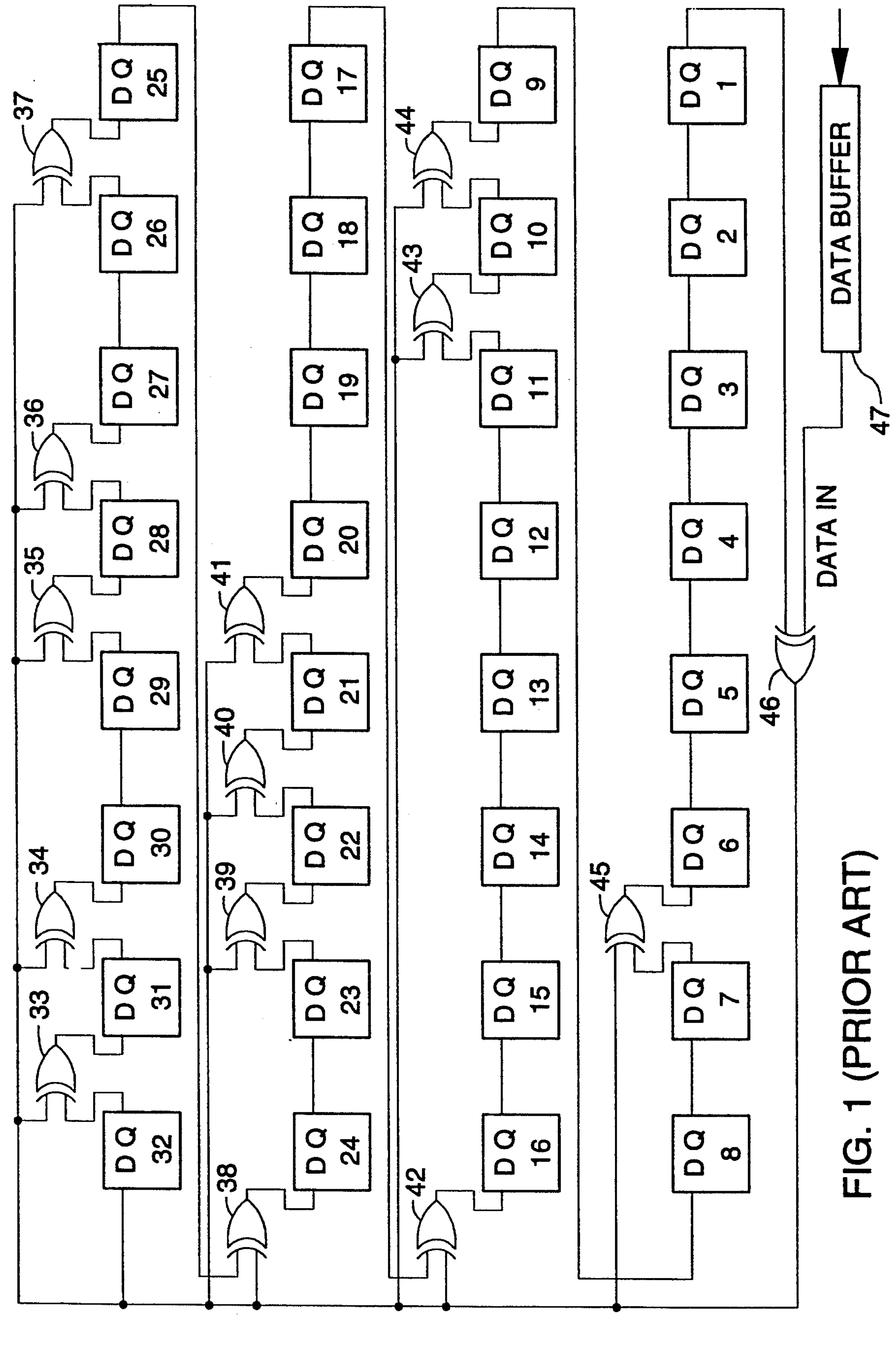
FIG. 1 is a typical prior art hardware implementation of the CRC-32 polynomial: $X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$.

Attention is first directed to FIG. 1 which is a typical prior art hardware implementation of the CRC-32 polynomial:

$$X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$$

A shift register has thirty-two stages, 1–32, in which adjacent stages may be directly coupled, output of the higher numbered to input of the lower numbered, or may be coupled by an EXCLUSIVE-OR-gate (XOR-gate), 33–45, driven by the output of the higher numbered stage and by the output of another XOR-gate 46 which is itself driven by the output of stage 1 and by the data in signal. It will be noted in FIG. 1 that the polynomial, determined by the placement of the several XOR-gates, is implemented in reverse; i.e., the actual polynomial is hexadecimal EDB88320. When performing binary arithmetic, the remainder in a division will always be one bit less than the divisor since the most significant bit of the divisor is a one. Therefore, it may be also noted that the most significant bit in the hardware, $X^{32}$, is implied.

The hardware in FIG. 1 performs a bit-by-bit operation. FIGS. 2A, 2B represent the contents (C32–C1) of the CRC shift register prior to its receiving a new data word from a data buffer 47. FIGS. 3A, 3B through FIGS. 10A, 10B illustrate the contents of the shift register after each of eight successive shifts (i.e., through one full byte). In FIGS. 3A, 3B through FIGS. 10A, 10B, M8–M1 represent a byte of data and R32– R1 represents the CRC register from the most significant bit (MSB) to the least significant bit (LSB). The left side of each of FIGS. 3A–10A shows the shift performed and the bit of data considered in the shift. All the elements in each column in each of FIGS. 3A, 3B through FIGS. 10A are XORed together to obtain the state of the CRC for a particular shift. For example, the state of R32 at shift 8 is:

$$R32=C8+M8+C2+M2$$

It will be seen that the state of CRC register stage 32 after shift eight equals the initial CRC register bits 8 and 2 and data bits 8 and 2, all XORed together to obtain the resultant R32 at that point in the operation. Since anything XORed with itself is zero, the state of the CRC register after shift eight can be simplified as shown in FIGS. 11A, 11B. The state of the CRC register after shift eight can be made more readable if $X_i$ is substituted for $C_i+M_i$ as shown in FIGS. 12A, 12B. It will be observed that these $X_i$'s are just the data bits XORed with the least significant byte of the original four-byte CRC.

No definite pattern is obvious from FIGS. 11A, 11B; however, by separating the $X_i$'s into groups, FIG. 12 is arrived at, and an unexpected pattern becomes evident;

1. The first row is the original CRC shifted right eight bits.
2. The second row is a representation of X8 as the original (reversed) polynomial, hexadecimal EDB88320. Each successive row after that, down to X3, is a representation of the same polynomial shifted right one bit.
3. X2 is a representation of the polynomial EE-0E612C, and X1 is manifested as the polynomial of X2 shifted right one.

The representations of the polynomial EE0E612C observed in the rows containing X2 and X1 appear whenever the original, first predetermined polynomial is EDB88320. A different polynomial representation is observed in the rows containing X2 and X1 when a different CRC polynomial is employed. This second predetermined polynomial may then be determined in the same manner as described above or through an equivalent analysis.

Only after the unexpected pattern and relationship are discovered can the basic steps to generate the checksum in software be established as follows:

1. Get the length of the data buffer.
2. Get the address of the data buffer.
3. Get the original CRC.
4. XOR the data byte with the least significant byte of the CRC as currently positioned (these are the Xi's).
5. Shift the CRC right eight bits.
6. Test each bit of Xi to see if it is a one or a zero.
    a. If the bit is a zero, the CRC remains unchanged for this bit.
    b. If the bit is a one, then XOR the shifted CRC with the appropriate polynomial.
7. Increment the address buffer and decrement the buffer count.
8. If the buffer count is not zero, loop to Step 4.

Consider now an exemplary Intel 386 assembly language program which generates a checksum using the polynomial $^{32}+X^{26}+X^{23}+X^{22}+X^{16}+X^{12}+X^{11}+X^{10}+X^{8}+X^{7}+X^{5}+X^{4}+X^{2}+X^{1}+X^{0}$ (reversed to EDB88320) in accordance with the invention. The following subroutine will calculate a checksum for any array of data incorporating 8-bit data bytes; for example, it may be used to process an array of 64K bytes to obtain a checksum of 32 bits to be appended thereto. As previously noted, this standard polynomial is in wide use and will protect 536 megabytes of contiguous data.

```
.MODEL LARGE
.386P
PUBLIC _crc
.DATA
_crc
.CODE
     PUBLIC      _crc
_crc32   PROC
           PUSH     BP
           MOV      BP,SP
           PUSH     SI
           MOV      EXC,00000000h
           MOV      CX,[BP + 6]         ;GET LENGTH OF DATA
                                        ;BUFFER (Step 1)
           MOV      SI,[BP + 10]        ;GET BUFFER ADDRESS
```

-continued

```
                                        ;(Step 2)
        MOV     EAX,_crc                ;ORIGINAL CRC
                                        ;INITIALIZED FROM
                                        ;CALLING ROUTINE
                                        ;(Step 3)
START:
        MOV     DX,[SI]                 ;MOVE DATA BYTE INTO
                                        ;DL
        XOR     DL,AL                   ;8 BITS OF DL = X8 to X1
                                        ;(Step 4)
        SHR     EAX,8                   ;(R32 . . . R25 = 0) -
                                        ;(R24 . . . R1 = C32 . . .
                                        ;C9)
                                        ;(Step 5)
        MOV     EBX,0EDB88320h          ;MOVE CRC POLYNOMIAL
                                        ;(REVERSED) TO BX
X8:     TEST    DL,80h                  ;CHECK X8 (Step 6)
        JZ      X7                      ;IF X8. ≠ 1, THEN DON'T
                                        ;XOR FOR THE X8 TERMS
                                        ;(Step 6a)
        XOR     EAX,EBX                 ;IF X8 = 1, THEN DO
                                        ;THE XOR WITH THE
                                        ;SHIFTED CRC
                                        ;(Step 6b)
X7      SHR     EBX,1                   ;SHIFT THE
                                        ;POLYNOMIAL TO READY
                                        ;IT FOR X7
        TEST    DL,40h                  ;REPEAT THE
                                        ;PROCEDURE AT LABEL
                                        ;"X8" FOR ALL Xi
        JZ      X6
        XOR     EAX,EBX
X6:     SHR     EBX,1
        TEST    DL,20h
        JZ      X5
        XOR     EAX,EBX
X5      SHR     EBX,1
        TEST    DL,10h
        JZ      X4
        XOR     EAX,EBX
X4      SHR     EBX,1
        TEST    DL,10h
        JZ      X3
        XOR     EAX,EBX
X3      SHR     EBX,1
        TEST    DL,10h
        JZ      X2
        XOR     EAX,EBX
X2      MOV     EBX,0EE0E612Ch
        TEST    DL,02h
        JZ      X1
        XOR     EAX,EBX
X1      SHR     EBX,1
        TEST    DL,10h
        JZ      DONE                    ;CURRENT BYTE
                                        ;COMPLETED
        XOR     EAX,EBX
DONE:   INC     SI                      ;(Step 7)
        LOOP    START                   ;(Step 8)
        MOV     _crc,EAX
        POP     SI
        MOV     SP,BP
        POP     BP
        RET
_CRC32  ENDP
        END
```

There are CRC routines in existence which generate tables consisting of all possible combinations of the CRC. Checksum generation is then reduced to a table look-up. These CRC routines are considered to be the fastest available. The assembly language routine above was tested against a table look-up version. Each routine was run 1000 times against the same 64K bytes of data on an IBM compatible 386 machine. The measurement device used was the system clock. Overhead procedures, such as disk access and looping routines, were measured and then subtracted out of the total times. The average checksum calculation time for 64K bytes of data using the table look-up method was 0.242 seconds. The average time using the subject method was 0.587 seconds. It will be observed that, while the table look-up method is a little more than twice as fast as the subject method, the table look-up method requires a substantial amount of memory to store the table.

In summary, the subject method of generating cyclic redundancy codes presented is easily implemented, requires little code, is as fast as anything short of hardware or the use of a memory intensive table look-up procedure and will protect very large quantities of data. The general analysis case can be applied to higher order polynomials and wider data input paths if required by an application.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A method for effecting the high integrity transfer from a source to a destination of a binary data set consisting of a plurality of 8-bit bytes, which method includes using a predetermined 32-bit binary polynomial to generate a checksum, said method comprising the steps of:

A) at the source, reversing the 32-bit binary polynomial to obtain an initial CRC;

B) XORing the least significant unprocessed byte of the data set with the least significant 8-bit byte of the CRC as currently positioned to obtain X8, X7, X6, X5, X4, X3, X2, X1, collectively Xi;

C) shifting the CRC right eight bits;

D) for Xi=X8 to X3, inclusive, successively testing the highest numbered unprocessed Xi bit to determine if it is a one or a zero;

a) if the Xi bit being tested is a zero, the CRC remains unchanged for this bit;

b) if the Xi bit being tested is a one, then XOR the shifted CRC with the a 32-bit pattern of Xi corresponding to the initial CRC shifted right zero places for X8, one place for X7, two places for X6, three places for X5, four places for X4 and five places for X3;

E) for Xi=X2 and X1, successively testing the highest numbered unprocessed Xi bit to determine if it is a one or a zero;

a) if the Xi bit being tested is a zero, the CRC remains unchanged for this bit;

b) if the Xi bit being tested is a one, then XOR the shifted CRC with the a 32-bit pattern of Xi corresponding to a second predetermined 32-bit binary polynomial shifted right zero places for X2 and one place for X1;

F) if bytes of the data set remain to be processed, returning to step B);

G) if the last byte in the data set has been processed, appending the current value of the CRC to the data set as a checksum;

H) transmitting the data set and appended checksum to the destination;

I) at the destination, dividing the data set and appended checksum by the predetermined polynomial to obtain a quotient and a remainder;

J) testing the remainder obtained in step I) to determine if it has a value of zero; and K) if the test performed during step J) reveals that the remainder does not have a value of zero, providing an indication that the data set transmitted to the destination during step H) has been corrupted.

2. A method for effecting the high integrity transfer from a source to a destination of a binary data set consisting of a plurality of 8-bit bytes, which method includes using the 32-bit binary polynomial, $X^{32}+X^{26}+X^{23}+X^{22}+X^{16}+X^{12}+X^{11}+X^{10}+X^{8}+X^{7}+X^{5}+X^{4}+X^{2}+X^{1}+X^{0}$ to generate a checksum, said method comprising the steps of:

A) reversing the 32-bit binary polynomial to obtain hexadecimal EDB88320 as an initial CRC;

B) XORing the least significant unprocessed byte of the data set with the least significant 8-bit byte of the CRC as currently positioned to obtain X8, X7, X6, X5, X4, X3, X2, X1, collectively Xi;

C) shifting the CRC right eight bits;

D) for Xi=X8 to X3, inclusive, successively testing the highest numbered unprocessed Xi bit to determine if it is a one or a zero;

a) if the Xi bit being tested is a zero, the CRC remains unchanged for this bit;

b) if the Xi bit being tested is a one, then XOR the shifted CRC with the a 32-bit pattern of Xi corresponding to hexadecimal EDB88320 shifted right zero places for X8, one place for X7, two places for X6, three places for X5, four places for X4 and five places for X3;

E) for Xi=X2 and X1, successively testing the highest numbered unprocessed Xi bit to determine if it is a one or zero;

a) if the Xi bit being tested is a zero, the CRC remains unchanged for this bit;

b) if the Xi bit being tested is a one, then XOR the shifted CRC with the a 32-bit pattern of Xi corresponding to hexadecimal EE0E612C shifted right zero places for X2 and one place for X1;

F) if bytes of the data set remain to be processed, returning to step B);

G) if the last byte in the data set has been processed, appending the current value of the CRC to the data set as a checksum;

H) transmitting the data set and appended checksum to the destination;

I) at the destination, dividing the data set and appended checksum by the 32-bit binary polynomial to obtain a quotient and a remainder;

J) testing the remainder obtained in step I) to determine if it has a value of zero; and K) if the test performed during step J) reveals that the remainder does not have a value of zero, providing an indication that the data set transmitted to the destination during step H) has been corrupted.

* * * * *